United States Patent
Blaum et al.

(10) Patent No.: US 7,032,140 B2
(45) Date of Patent: Apr. 18, 2006

(54) METHOD AND SYSTEM FOR SYNCHRONIZATION IN THE PRESENCE OF THERMAL ASPERITY

(75) Inventors: Mario Blaum, San Jose, CA (US); Arvind Motibhai Patel, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 708 days.

(21) Appl. No.: 09/849,397

(22) Filed: May 7, 2001

(65) Prior Publication Data

US 2002/0166094 A1 Nov. 7, 2002

(51) Int. Cl.
*H04L 7/04* (2006.01)
*G11B 5/09* (2006.01)

(52) U.S. Cl. .................. 714/707; 360/51; 375/355; 375/366; 375/368; 714/777

(58) Field of Classification Search ................ 375/355, 375/365–366, 368; 714/707, 777; 360/61, 360/26, 51
See application file for complete search history.

(56) References Cited

U.S. PATENT DOCUMENTS

| | | | | |
|---|---|---|---|---|
| 3,251,034 A | * | 5/1966 | Goode et al. | 375/365 |
| 3,261,001 A | * | 7/1966 | Magnin | 375/365 |
| 4,499,507 A | * | 2/1985 | Yamada et al. | 360/26 |
| 4,575,774 A | * | 3/1986 | Tarbox et al. | 360/72.2 |
| 4,931,884 A | * | 6/1990 | Aoki | 360/26 |
| 5,347,517 A | * | 9/1994 | Satomura et al. | 714/708 |
| 5,844,920 A | * | 12/1998 | Zook et al. | 360/51 |
| 5,940,233 A | | 8/1999 | Malone, Sr. | |
| 5,999,110 A | | 12/1999 | Blaum et al. | |
| 6,089,749 A | | 7/2000 | Blaum et al. | |
| 6,128,358 A | * | 10/2000 | Urata | 375/366 |
| 6,249,319 B1 | * | 6/2001 | Post | 348/515 |
| 6,680,807 B1 | * | 1/2004 | She et al. | 360/51 |
| 6,690,523 B1 | * | 2/2004 | Nguyen et al. | 360/31 |
| 6,690,524 B1 | * | 2/2004 | Wakefield et al. | 360/51 |
| 6,693,760 B1 | * | 2/2004 | Krounbi et al. | 360/75 |
| 6,711,225 B1 | * | 3/2004 | Sutardja et al. | 375/364 |
| 2002/0166094 A1 | * | 11/2002 | Blaum et al. | 714/777 |

FOREIGN PATENT DOCUMENTS

JP H11-341066 A * 12/1999
WO WO 98/14936 4/1998

OTHER PUBLICATIONS

The American Heritage® Dictionary of the English Language: Fourth Edition. 2000; entry for "Slid". Available at http://www.bartleby.com/61/29/S0472900.html.*

* cited by examiner

*Primary Examiner*—R. Stephen Dildine
(74) *Attorney, Agent, or Firm*—John J. Dresch, Esq.; Patrick W. Duncan

(57) ABSTRACT

A method (and system) of finding byte synchronization over random data, which includes selecting a synchronization symbol maximizing the Hamming distance when slid over itself, and appending the synchronization symbol to random data.

37 Claims, 5 Drawing Sheets

| d | | | | | | | | | | | | | | | | |
|---|---|---|---|---|---|---|---|---|---|---|---|---|---|---|---|---|
| d | x | x | x | x | 0 | 0 | 0 | 1 | 1 | 0 | 1 | 0 | x | x | x | x |
| 3 | 0 | 0 | 0 | 1 | 1 | 0 | 1 | 0 | | | | | | | | |
| 3 | | 0 | 0 | 0 | 1 | 1 | 0 | 1 | 0 | | | | | | | |
| 3 | | | 0 | 0 | 0 | 1 | 1 | 0 | 1 | 0 | | | | | | |
| 4 | | | | 0 | 0 | 0 | 1 | 1 | 0 | 1 | 0 | | | | | |
| 0 | | | | | 0 | 0 | 0 | 1 | 1 | 0 | 1 | 0 | | | | |
| 4 | | | | | | 0 | 0 | 0 | 1 | 1 | 0 | 1 | 0 | | | |
| 3 | | | | | | | 0 | 0 | 0 | 1 | 1 | 0 | 1 | 0 | | |
| 3 | | | | | | | | 0 | 0 | 0 | 1 | 1 | 0 | 1 | 0 | |
| 3 | | | | | | | | | 0 | 0 | 0 | 1 | 1 | 0 | 1 | 0 |
| d | x | x | x | x | 0 | 0 | 0 | 1 | 1 | 0 | 1 | 0 | x | x | x | x |

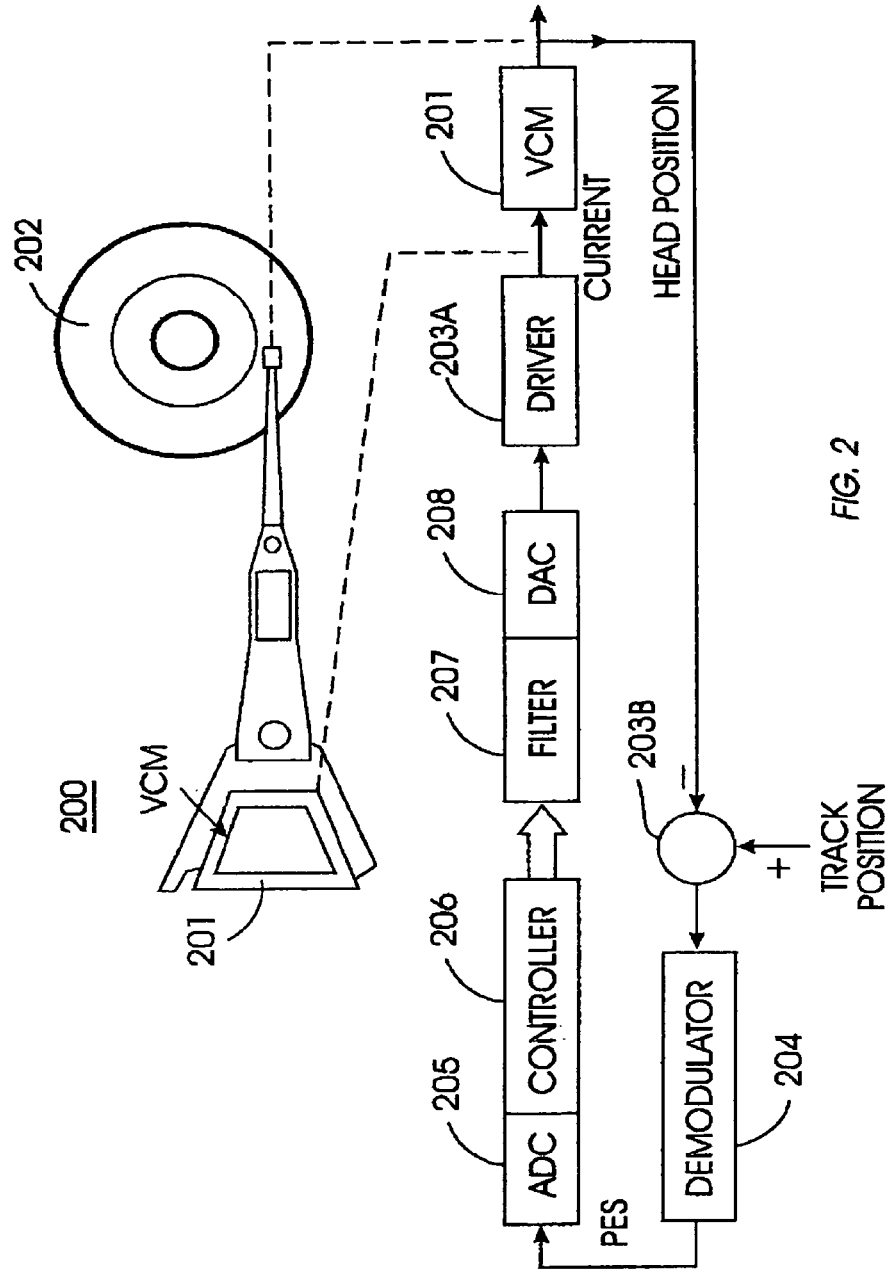

| | | | | | | | | | | |
|---|---|---|---|---|---|---|---|---|---|---|
| d | x | x | x | x | 0 | 0 | 1 | 1 | 0 | x x x x |
| 3 | 0 | 0 | 0 | 1 | 1 | 0 | 0 | 1 | 0 | |
| 3 | | 0 | 0 | 0 | 1 | 0 | 1 | 0 | | |
| 3 | | | 0 | 0 | 1 | 0 | 1 | 0 | | |
| 4 | | | | 0 | 1 | 1 | 0 | 1 | 0 | 0 |
| 0 | | | | | 0 | 0 | 1 | 1 | 0 | 1 0 |
| 4 | | | | | 0 | 0 | 0 | 1 | 1 | 0 1 0 |
| 3 | | | | | | 0 | 0 | 0 | 1 | 1 0 1 0 |
| 3 | | | | | | 0 | 0 | 0 | 0 | 1 1 0 1 0 |
| 3 | | | | | | | | 0 | 0 | 0 1 0 |
| d | x | x | x | x | 0 | 0 | 1 | 1 | 0 | x x x x |

*FIG. 5*

METHOD AND SYSTEM FOR SYNCHRONIZATION IN THE PRESENCE OF THERMAL ASPERITY

BACKGROUND OF THE INVENTION

1. Field of the Invention

The present invention generally relates to a disk drive, and more particularly to a disk drive with dual synchronization fields in which a second synchronization field contains only a byte synchronization portion, is error tolerant and is preceded by random data.

2. Description of the Related Art

Oftentimes, problems may occur which destroy data in a data stream, or prevents it from being recovered.

For instance, one such problem is the so called "thermal-asperity problem". If, for instance, a thermal-asperity hits the data portion of a sector, then normally the lost data is recovered using known techniques like error-correction codes (ECC). If the thermal-asperity, on the other hand, hits the synchronization field preceding the data, then the data may be lost since, if synchronization is lost, the proper timing or byte synchronization may not be present. In order to avoid such problems, some conventional disk drive systems utilize dual synchronization (hereafter "sync") fields for each data header. Each sync field consists of two parts: a bit-synchronization part, or variable frequency oscillator (VFO) part, and a byte synchronization part ("sync" herein after). The VFO can be thought as a preamble of 1s, while the byte sync part is a vector following it and generally possessing error tolerant properties. By utilizing two sync fields as opposed to one, the problem of catastrophic failures (such as thermal asperity) affecting it is mitigated. In effect, if the two sync fields are sufficiently separated, it is expected that at least one of them will survive a thermal-asperity type of defect. However, this approach is problematic because it takes up valuable "real estate" in the stream which otherwise could be used for the data payload. That is, this conventional method, as further described below, is disadvantageous since it limits the amount of data which could be written to the disk since such a preamble of 1s (e.g., non data) must be employed.

Hence, before reading a data sector, it is necessary to achieve correct synchronization. There are two types of synchronization that must be achieved: bit-synchronization and byte-synchronization.

To this end, as mentioned above, a synchronization field is added in front of the data sector, and this synchronization field is divided into two portions. A first portion is termed a "bit-synchronization field" (e.g., also called the preamble or the VFO field), which normally includes a sufficiently long (i.e., its length depends on the application and the type of errors normally expected to be encountered) string of 1s. FIG. 1 shows a typical example of the way double sync fields are implemented today: a first sync field, consisting of a VFO portion (denoted Sync1) followed by a byte sync portion (denoted SB1), and a second sync field, consisting of a VFO portion (denoted Sync2) followed by a byte sync portion (denoted SB2). For the sake of example, we assume that Sync1 is 24 bytes (i.e., 192 bits) long, Sync2 is 16 bytes long, and both SB1 and SB2 are 4 bytes long.

Traditionally, without the double sync field, the byte synchronization portion following the VFO is generally tolerant to a limited number of errors, and once the end of this byte synchronization portion is identified, the beginning of the data can be read.

However, as mentioned above, one of the problems with this scheme is the presence of Thermal Asperities (TA). TA occurs when, for example, the read/write head is too close to the disk being read or written to. The effect of TA is a relatively long burst of errors. For example, such errors may take the form of an "empty signal" which carries no information, such as by having a loss of amplitude of the signal (e.g., no highs or lows, thereby not allowing 1s or 0s to be detected), etc. If TA occurs in data, it is expected that the errors will be recovered by the error-correcting code (ECC) protecting the data (normally, the ECC adds redundancy at the end of the data which is used for correction and detection of errors). Typically, Reed-Solomon (RS) codes are used as the ECC. Techniques like interleaving of RS codes permit the correction of relatively long bursts of errors.

As mentioned above, the problem changes when TA affects the sync field. In that case, a TA may cause a loss of either bit-sync or of byte-sync. Therefore, if the beginning of the data cannot be identified, then it cannot be determined where the bytes are.

To solve this problem, for instance, in one conventional system employing a disk system and a Lucent® Channel for reading data, a "double-sync" scheme has been implemented. Schematically, the double-sync in such a system appears as shown in FIG. 1 (i.e., the units are in bytes).

In FIG. 1, "Sync" denotes the VFO field and "SB" denotes the byte synchronization field. As shown in FIG. 1, the conventional arrangement requires 24 bytes for Sync1, 4 bytes for SB1, 16 bytes for Sync2, and 4 bytes for SB2.

Hence, in the conventional system, the Lucent channel requires a 4-byte byte sync field, although simulations by the present inventors show that very good byte sync can be achieved with only two bytes of byte sync field. This should be considered for future products not using the Lucent® channel, or even if the Lucent® channel is continued, its specifications might be modified in order to accommodate a more efficient format. Notwithstanding, there are still problems with this arrangement.

That is, in the conventional systems, a dual sync is used including a second VFO field Sync2. As a result, bit-sync can occur even in the event of TA. Further, if TA wipes out the first sync field and part of the data, the second sync field SB2 retrieves byte-sync. Obviously, there may be other causes other than TA for wiping out the byte synchronization symbol of the first field.

However, this comes at a high price of disk "real estate" being unavailable for data (e.g., payload). The highest price comes from Sync2: it uses 16 bytes, and it would be desirable to eliminate this field, provided that TAs can be handled.

SUMMARY OF THE INVENTION

In view of the foregoing and other problems, drawbacks and disadvantages of the conventional methods and structures, an object of the present invention is to provide a data structure and method for disk drive systems.

Another object is to provide dual sync bytes for each data header of a disk drive, in which the second sync byte is error tolerant but is preceded by random data, not a conventional VFO field as in conventional systems.

In a first aspect of the present invention, a method (as well as system and programmable storage medium for storing program steps of the method) of finding byte synchronization, includes appending a synchronization symbol to random data.

With the unique and unobvious aspects of the present invention, a scheme is provided in which more space on the disk can be used for data such that dual byte sync portions can be provided for each data header of a disk drive, in which the second byte sync portion is error tolerant but is preceded by random data. For example, by using the invention, the 16 bytes corresponding to Sync2 in FIG. 1 may be used for storing data.

BRIEF DESCRIPTION OF THE DRAWINGS

The foregoing and other objects, aspects and advantages will be better understood from the following detailed description of preferred embodiments of the invention with reference to the drawings, in which:

FIG. 1 is a schematic diagram of a conventional double-sync arrangement;

FIG. 2 is a perspective view representation of a disk drive data storage device for use with the present invention;

FIG. 5 illustrates a flow diagram illustrating a preferred method of the invention;

DETAILED DESCRIPTION OF PREFERRED EMBODIMENTS OF THE INVENTION

Figures 3, 4:
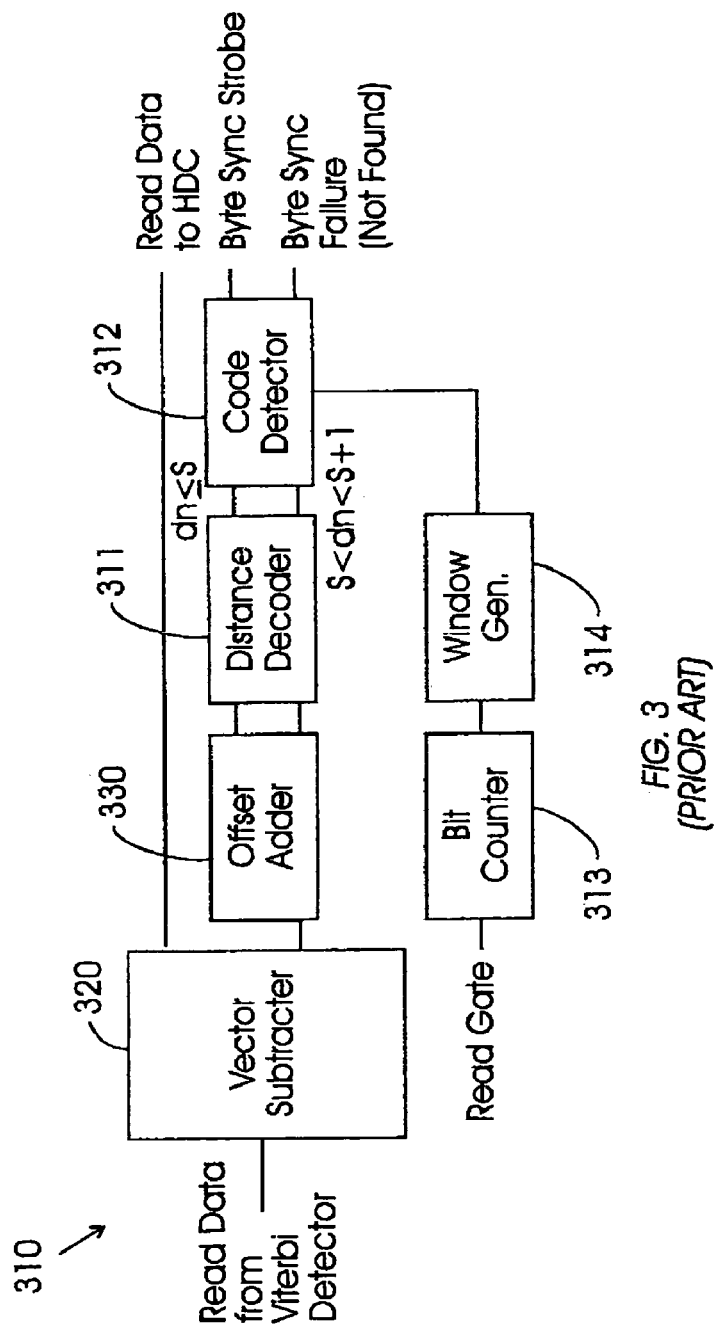
FIG. 3 is a block diagram of a conventional ECC byte synchronization detector circuit which can be used with the present invention.
FIG. 4 is a schematic indicating an arrangement according to the present invention.

Referring now to the drawings, and more particularly to FIGS. 2–7, there is shown a preferred embodiment of a synchronization method (and system) in the presence of thermal asperity, and data structure for use therewith, according to the present invention.

Referring to FIG. 2, an exemplary disk recording and reproducing system 200 is illustrated that can be used with the present invention. The exemplary disk drive system 200 typically contains an actuator, a servo system, etc. for reliably reading and writing to a disk. The system 200 may include a voice coil motor (VCM) 201 for reading from/writing to a disk 202.

As shown, a feedback loop includes a driver 203A for driving the VCM 201. The head position of the VCM 201 is controlled by the feedback loop including a summing circuit 203B receiving a track position signal, a demodulator 204 for producing a position error signal, an analog-to-digital converter (ADC) 205 for converting the analog position error signal to a digital signal, a controller 206 for controlling the filter based on an input from the ADC 205, a digital filter 207, and a digital-to-analog converter 208 for providing the signal to the driver 203A.

FIG. 3 illustrates a conventional ECC byte synchronization detector circuit 310, as described in U.S. Pat. No. 6,089,749 to Blaum et al., which describes conventional byte sync with error correcting capabilities and incorporated herein by reference, and which can be used with the disk recording and reproducing system of the present invention.

Specifically, FIG. 3 shows a schematic block diagram of an ECC byte synchronization detector circuit 310. Byte synchronization detector circuit 310 includes a vector subtractor circuit 320, an offset adder circuit 330, a distance decoder circuit 311 and a code detector circuit 312. Vector subtractor circuit 320 and offset adder circuit 330 form the primary portion of circuit 310, and provide vector subtraction and addition of the elements of the ECC code for obtaining the Hamming distance between a zero vector and an error vector. A bit counter 313 and a window generator 314 operate in a well-known manner for producing a detecting window during the period of time when the ECC code is expected to occur.

With the above structure and environment in mind and turning now to the present invention generally, as mentioned above, the invention is directed to a method for byte synchronization in the presence of anomalous conditions (e.g., thermal asperity (TA)). It avoids the dual sync field by synchronizing directly over data without a second bit synchronization field. Hereinbelow, a method and apparatus for achieving such synchronization over data, are described.

The purpose of the invention is to provide an alternative to dual sync, basically by eliminating the second VFO field Synch2 and replacing it with data. The new scheme operates as shown in FIG. 4.

That is, the structure as shown in FIG. 4 provides bit-sync even in the event of TA. Perhaps, depending on the length of TAs, the VFO field Sync1 may need to be lengthened somehow, but efficiency in format is achieved.

Hence if TA destroys the first byte sync field SB1 and a portion of the data, the second byte sync field SB2 retrieves byte-sync. The difficulty is synchronizing over random data, since there is no control over it. In effect, it is possible that the second sync field appears in random data. Hereinbelow, with the unique and unobvious structure of the present invention, it is described how to overcome these difficulties.

The inventive method will be illustrated with an exemplary 1-byte (8 bits) byte-sync pattern. This pattern maximizes the minimum distance when slid over itself. Later, a 4-byte (32 bits) pattern will be presented that is optimal with this property.

In FIG. 5, x represents random data, that are followed by the 8-bit pattern 0 0 0 1 1 0 1 0, and then again by random data. A window 4 bits before the pattern arrives is opened, and the window is closed 4 bits later.

Then, the inventive method measures the Hamming-distance between the pattern and the read sequence, where the distance to a data bit x counts as 0. Measuring the Hamming-distance is well known in the industry and is described, for example, in U.S. Pat. Nos. 5,999,110 and 6,089,749, both incorporated herein by reference.

The result is registered in the left column. Then, the window is slid until 4 bits after the end of the inventive pattern. The result is as shown in FIG. 5. It can be seen that the Hamming distance is 3 or more, except when the pattern has been found. This property allows for tolerance of one error within the window considered.

The method of the present invention can be utilized with any length of byte-sync. In the preferred embodiment, a 4 byte (32 bits) byte-sync pattern is selected. In this case, by opening the window 2 bytes before the pattern and closing it 2 bytes after the pattern, the minimum distance is 12 (i.e., it can tolerate up to 5 errors and detect 6). Since, in a partial response channel with a precoder, errors tend to occur in pairs, the pattern was utilized for correction of 4 errors only.

The 4-byte pattern chosen is 00000001 10110111 11101010 00011000

The minimum distance of 12 given by this pattern is optimal (i.e., there is no 32-bit pattern giving a distance of 13).

The system is very robust if it can be assured that the search opens in a window 2 bytes before and 2 bytes after the correct pattern is located. Unfortunately, this appears not to be the case, and the window may open up to 8 bytes before and 8 bytes after the correct pattern. Therefore, it can be looked for in random data. It is noted that "opening the window" is another common procedure in the art and would be easily known by one of ordinary skill in the art within the purview of the present application.

However, it is unlikely that this 32-bit pattern will be found in random data. If it is found, there are several possible strategies.

One strategy is to make a few artificial errors in the data to make the pattern disappear. These few errors will be later corrected by the powerful ECC. Another alternative is to register the occurrence of the pattern in data, in which case it will be known that it has occurred previously to the correct sync field.

The system was simulated assuming 15 bytes of random data followed by the 4-byte sync pattern and then by another 15 bytes of random data. These 34 bytes were transferred into PR4 by alternating signs in even and odd subsequences (note: the technique can certainly be applied also to EPR4 or $E^2PR4$, PR4 is given for illustration purpose only). Then, white gaussian noise was added.

At the decoding, the Viterbi decoding algorithm was applied followed by the postcoder $1 \oplus D^2$.

This gave a noisy version of the original sequence with an error rate 0.01 (extreme!).

Then, the 4-byte sync pattern was searched for within a Hamming distance of 4. That is, a window was slided, starting 8 bytes before and finishing 8 bytes after the beginning of the 4-byte sync pattern (note: corrective measures were not taken to prevent the occurrence of the sync pattern in this simulation).

Within the pattern at a distance of 4 or less, the first one giving the smallest distance, was taken. If no pattern at distance 4 or less was found, an uncorrectable error was declared (e.g., unable to achieve sync).

After 100,000 experiments, only in 0.128% of the cases the correct sync failed to be achieved. There were two cases of false sync (0.002%), and, in 0.126% of the cases, sync was not achieved. 30,000 experiments were run under less extreme conditions, with a noise level of $10^{-5}$, and in no case synchronization failed to be achieved.

Figure 6:
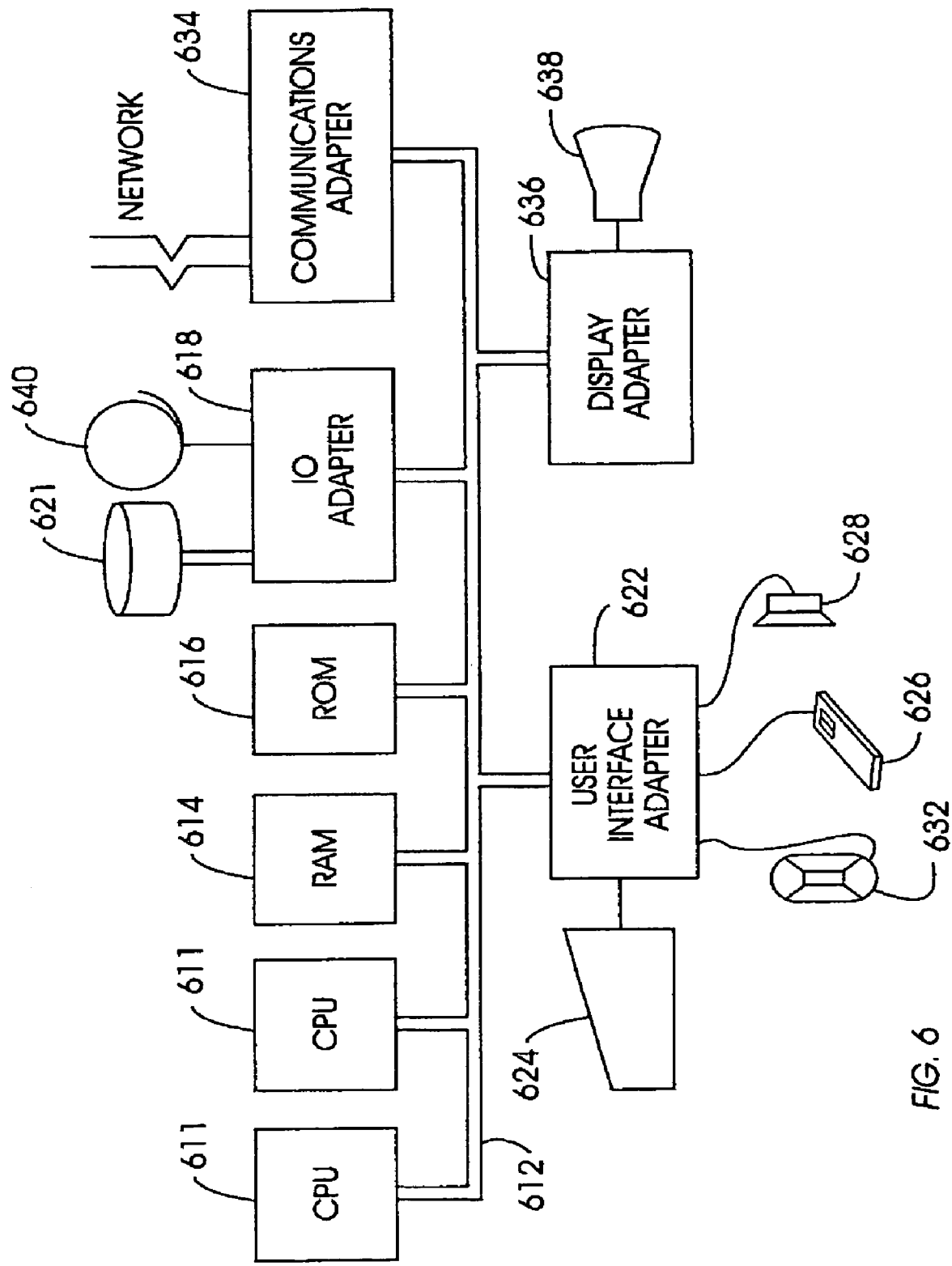
FIG. 6 illustrates an exemplary hardware/information handling system 600 for incorporating the present invention therein.
Figure 7:
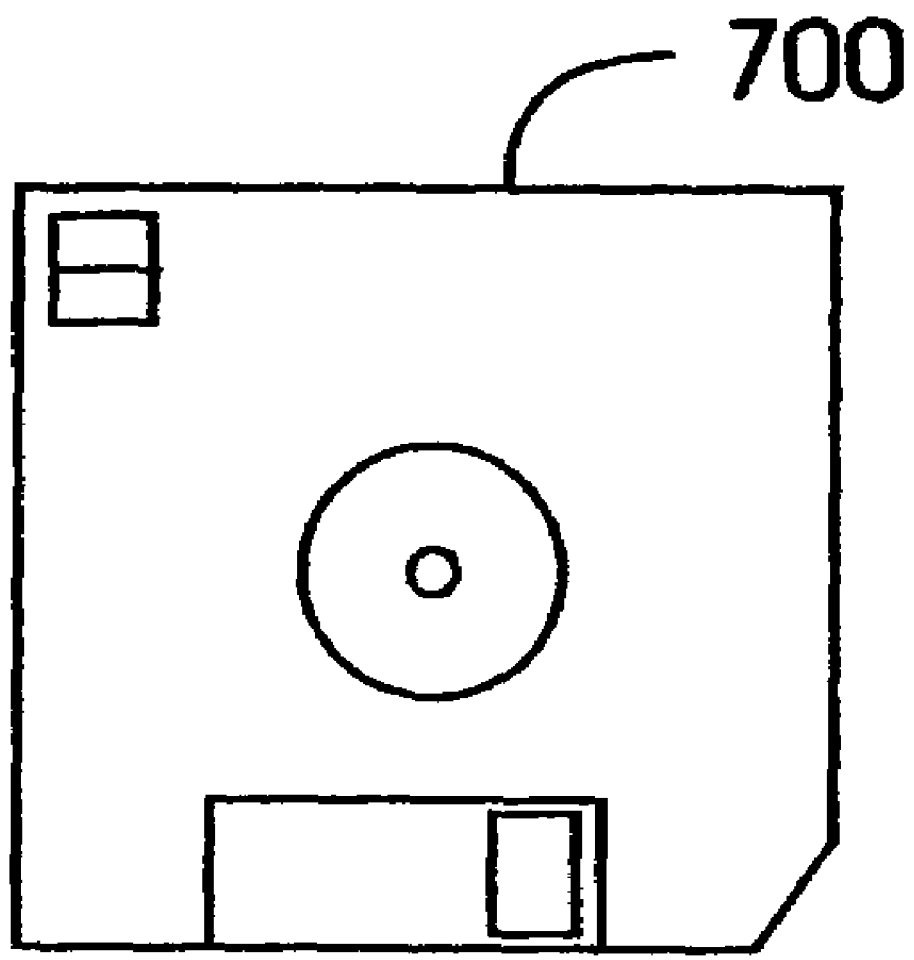
FIG. 7 illustrates a signal bearing medium 700 (e.g., storage medium) for storing steps of a program of a method according to the present invention.

FIG. 6 illustrates a typical hardware configuration of an information handling/computer system in accordance with the invention and which preferably has at least one processor or central processing unit (CPU) 611.

The CPUs 611 are interconnected via a system bus 612 to a random access memory (RAM) 614, read-only memory (ROM) 616, input/output (I/O) adapter 618 (for connecting peripheral devices such as disk units 621 and tape drives 640 to the bus 612), user interface adapter 622 (for connecting a keyboard 624, mouse 626, speaker 628, microphone 632, and/or other user interface device to the bus 612), a communication adapter 634 for connecting an information handling system to a data processing network, the Internet, an Intranet, a personal area network (PAN), etc., and a display adapter 636 for connecting the bus 612 to a display device 638 and/or printer 639 (e.g., a digital printer or the like).

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, comprising signal-bearing media tangibly embodying a program of machine-readable instructions executable by a digital data processor incorporating the CPU 611 and hardware above, to perform the method of the invention.

This signal-bearing media may include, for example, a RAM contained within the CPU 611, as represented by the fast-access storage for example.

Alternatively, the instructions may be contained in another signal-bearing media, such as a magnetic data storage diskette 700 (FIG. 7), directly or indirectly accessible by the CPU 611.

Whether contained in the diskette 700, the computer/CPU 611, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g. CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code, compiled from a language such as "C", etc.

The present invention was described mainly as an alternative to the dual sync fields utilized in the prior art. However, it can be utilized in any system attempting to perform byte synchronization over random data. For instance, such an error tolerant pattern may be used following data to check if the system is in byte sync, otherwise the pattern is used for byte resynchronization.

While the invention has been described in terms of preferred embodiments, those skilled in the art will recognize that the invention can be practiced with modification within the spirit and scope of the appended claims.

What is claimed is:

1. A method of finding byte synchronization in a magnetic recording disk by inserting a synchronization symbol into random data, wherein said synchronization symbol optimizes Hamming distance when slid over a concatenation of itself with random data.

2. The method of claim 1, further comprising opening a window at a certain point in the data and attempting to find the synchronization symbol by sliding the window until the synchronization symbol is found.

3. The method of claim 2, wherein said symbol comprises a synchronization pattern, and the pattern is considered found when the window is below a predetermined threshold in Hamming distance to the pattern.

4. The method of claim 1, wherein a pattern of a data format having said synchronization symbol and said random data, includes a bit-sync field.

5. The method of claim 1, wherein a data block format includes said random data, a first sync field, and first and second byte-sync fields, such that if an anomalous condition destroys said first byte-sync field and a portion of the random data, the second byte-sync field retrieves byte-sync, wherein synchronizing over the random data is performed.

6. The method of claim 5, wherein the random data portion is encoded using a modulation code.

7. The method of claim 5, further comprising utilizing a byte-sync pattern such that said pattern maximizes a minimum distance when slid over itself.

8. The method of claim 1, wherein a 4 byte byte-sync pattern is selected, such that by opening a window 2 bytes before the pattern and closing it 2 bytes after the pattern, the minimum distance is 12, representing that up to five errors are tolerated and that six errors are detected.

9. The method of claim 1, wherein the predetermined pattern chosen is
00000001 10110111 11101010 00011000 and a window is opened 2 bytes before said pattern and closed 2 bytes after said pattern.

10. The method of claim 1, wherein said random data is interposed between first and second byte-synchronization fields.

11. The method of claim 10, wherein the first and second byte-sync fields have different patterns.

12. The method of claim 10, wherein the first and second byte-sync fields have substantially identical patterns.

13. The method of claim 1, further comprising:
detecting whether the synchronization pattern, or a noisy version thereof, is present in the random data preceding said synchronization pattern.

14. The method of claim 13, further comprising:
when said synchronization pattern or said noisy version thereof are detected in data, forming an artificial error to remove said synchronization pattern or said noisy version thereof.

15. The method of claim 2, further comprising:
detecting whether the synchronization pattern, or a noisy version thereof, is present in the random data preceding said synchronization pattern.

16. The method of claim 15, further comprising:
when said synchronization pattern or said noisy version thereof are detected, forming an artificial error to remove said synchronization pattern or said noisy version thereof.

17. The method of claim 15, further comprising:
when said synchronization pattern or said noisy version thereof are detected, registering this information and informing the sliding window that a first occurrence of such a symbol is not the synchronization pattern.

18. The method of claim 17, further comprising:
when said synchronization pattern or said noisy version thereof are detected, registering this information and informing the sliding window that a first occurrence of such a symbol is not the synchronization pattern.

19. A system for finding byte synchronization in a magnetic recording disk comprising:
a synchronization symbol including predetermined Hamming distance properties when slid against different carts of itself; and
a unit for appending said synchronization symbol to random data.

20. The system of claim 19, further comprising means for opening a window at a certain point in the data and attempting to find the synchronization symbol by sliding the window until the synchronization symbol is found.

21. The system of claim 20, wherein said symbol comprises a synchronization pattern, and the pattern is considered found when the window is below a predetermined threshold in Hamming distance to the pattern.

22. The system of claim 19, wherein a pattern of a data format having said synchronization symbol and said random data, includes a bit-sync field.

23. The system of claim 19, wherein a data block format includes said random data, a first sync field, and first and second byte-sync fields, such that if an anomalous condition destroys said first byte-sync field and a portion of the random data, the second byte-sync field retrieves byte-sync, and
wherein synchronizing over the random data is performed.

24. The system of claim 23, wherein the random data portion is encoded using a modulation code.

25. The system of claim 23, further comprising means for utilizing a byte-sync pattern such that said pattern maximizes a minimum distance when slid over itself.

26. The system of claim 19, wherein a 4 byte byte-sync pattern is selected, such that by opening a window 2 bytes before the pattern and closing it 2 bytes after the pattern, the minimum distance is 12 representing that up to five errors are tolerated and that six errors are detected.

27. The system of claim 19, wherein the predetermined pattern chosen is
00000001 10110111 11101010 00011000 and a window is opened 2 bytes before and 2 bytes after the correct pattern is located.

28. The system of claim 19, wherein said random data is interposed between first and second byte-synchronization fields.

29. The system of claim 28, wherein the first and second byte-sync fields have different patterns.

30. The system of claim 28, wherein the first and second byte-sync fields have substantially identical patterns.

31. An encoder for finding byte synchronization in a magnetic recording disk, comprising:
a synchronization symbol including predetermined Hamming distance properties when slid over a concatenation of itself with random data; and
a unit for appending said synchronization symbol to random data.

32. A format for a contiguous data block of a disk drive, a controllably positionable head for storing user data in the data block, and a read channel responsive to the head for retrieving the user data from the data block, the data block format comprising:
a bit-sync field having a first sync pattern for synchronizing the read channel to enable the read channel to recover the user data from the data block; and
a random data field proximate said bit-sync field.

33. The format of claim 32, further comprising:
a first byte-sync field adjacent said bit-sync field; and
a second byte-sync field proximate said first byte-sync field.

34. The format of claim 33, wherein said random data field is interposed between said first and second byte-sync fields.

35. A format for a contiguous data block of a disk drive, a controllably positionable head for storing user data in the data block, and a read channel responsive to the head for retrieving the user data from the data block, the data block format comprising:
a sync field having a first sync pattern for synchronizing the read channel to enable the read channel to recover the user data from the data block;
a first byte-sync field adjacent said sync field;
a second byte-sync field proximate said first byte-sync field; and
a random data field interposed between said first and second byte-sync fields.

36. A signal-bearing medium tangibly embodying a program of machine-readable instructions executable by a digital processing apparatus to perform a method of finding synchronization in a magnetic recording disk, comprising:

appending a synchronization symbol to random data, wherein said symbol includes predetermined Hamming distance properties when slid over a concatenation of itself with said random data.

37. The signal-bearing medium of claim 36, further comprising:

finding a potentially noisy version of said synchronization symbol by opening a window in said random data.

* * * * *